United States Patent [19]

Mittag et al.

[11] Patent Number: 5,045,120
[45] Date of Patent: Sep. 3, 1991

[54] METHOD FOR CLEANING ELECTRONIC AND OTHER DEVICES

[75] Inventors: Michael T. Mittag, New-Haven, Vt.; Donald A. Elliott, Brossard; Alan S. Roberts, Pointe Claire, all of Canada

[73] Assignee: Electrovert Ltd., Ontario, Canada

[21] Appl. No.: 319,505

[22] Filed: Mar. 6, 1989

[51] Int. Cl.$^5$ ............................ B08B 3/02; B08B 3/04
[52] U.S. Cl. ...................................... 134/26; 134/21; 134/25.4; 134/32; 134/40; 134/73
[58] Field of Search ...................... 134/25.1, 25.4, 26, 134/30, 31, 32, 40, 73, 21

[56] References Cited

U.S. PATENT DOCUMENTS

| | | | |
|---|---|---|---|
| 3,021,235 | 2/1962 | Schumacher | 134/32 |
| 4,319,930 | 3/1982 | Yano et al. | 134/25.4 |
| 4,589,926 | 5/1986 | Holmstrand | 134/32 |
| 4,861,385 | 8/1989 | Yagishita | 134/26 |

Primary Examiner—Theodore Morris
Assistant Examiner—Saeed T. Chaudhry
Attorney, Agent, or Firm—Darby & Darby

[57] ABSTRACT

A method and apparatus for cleaning workpieces, particularly printed circuit boards upon which electrical components have been soldered, is capable of using a potentially flammable or explosive liquid cleaning solvent. In one embodiment, there are two immersion wash stages between which is a spray wash stage. The spray wash stage is formed as a closed chamber which is sealed when the immersion wash stages by liquid seals. To reduce the danger of fire or explosion in the spray wash stage an inert gas such as Nitrogen is introduced into the closed chamber. In another embodiment the spray nozzles are immersed in liquid solvent in a combined immersion/spray wash stage. This reduces atomization of the flammable solvent further reducing the danger of fire or explosion.

12 Claims, 2 Drawing Sheets

METHOD FOR CLEANING ELECTRONIC AND OTHER DEVICES

BACKGROUND OF THE INVENTION

This invention relates to the cleaning of workpieces, particularly but not exclusively to the cleaning of printed circuit boards upon which electrical components have been soldered.

When such circuit boards emerge from the soldering process they have thereon contaminants such as flux residues and the like which have to be removed by using a liquid cleaning solvent. One of the solvents used widely for such a task, namely stabilized, azeotrope of CFC-113 and methanol available commercially as Dupont Freon TMS, is totally safe from fire or explosive hazard. However, this solvent is known to deplete the ozone layer and will most probably become banned throughout the world by a large number of countries who signed the UNEP agreement in 1987.

New solvents or cleaning agents are being tried, not as direct substitutes, but as alternatives. Among these alternatives are Terpene solvents CYCLO-ALIPHATIC and Petroferm EC-7 and other LIMONENE based solvents which unfortunately have a low flash point and when sprayed as a cleaning agent for metal parts, electronics circuits and the like in air, the risk of a potential fire or explosion becomes very real.

Previously, solvents which are safe have been located in open top tank type cleaning machines, some of which may have had cooling coils to contain the solvent vapours within the open top tank. Other machines were made longer, some with multiple stages and a conveyor system consisting of either baskets on a transporting device or with a conveyor belt which would convey parts down into the open top tank into the vapour zone, sometimes also into the liquid cleaning solvent and which also may have been boiling and in some cases may also have had an improved mechanical cleaning effect with ultrasonic agitation of the solvent and/or with mechanical pumping devices and nozzles to spray on the workpiece which result in improved cleaning. The tops of these machines are sometimes closed to reduce solvent losses with entrance and exit openings for the workpieces.

With the recent advent of electronic circuits such as those containing surface mounted devices (SMD) and the like which are mounted quite flush to the circuit board and which are known to present cleaning difficulties, equipment has been developed with high pressure sprays up to the order of 200 psi (12 atmospheres) pressure and even higher. In order to contain the spray and resulting increased losses of the solvent associated with such high pressures, systems exist for transporting metal parts and the like in a basket transport system through liquid seals; see for example U.S. Pat. No. 3,120,853. More recently, vapour degreasing of workpieces through similar machines without transporting baskets but with an endless mesh belt transport conveyor with liquid seals for containment of the high pressure spray, whereby the high pressure spray and associated vapours are contained in a central zone and the entrance and exit zones are generally quiet, thereby resulting in high containment of the solvent in the machine.

The use of potentially flammable or explosive solvents in such cleaning machines is hazardous. This is particularly true for the central zone where the spray nozzles are located because of the intimate mixing of the liquid droplets in the air contained in that zone.

It is an object of the present invention to provide a method and apparatus which reduces this inherent danger.

SUMMARY OF THE INVENTION

The invention involves injecting into the central zone an inert gas such as $N_2$ to displace the air therefrom, thereby minimizing the potential for ignition or explosion.

DESCRIPTION OF PREFERRED EMBODIMENTS

Figure 1:
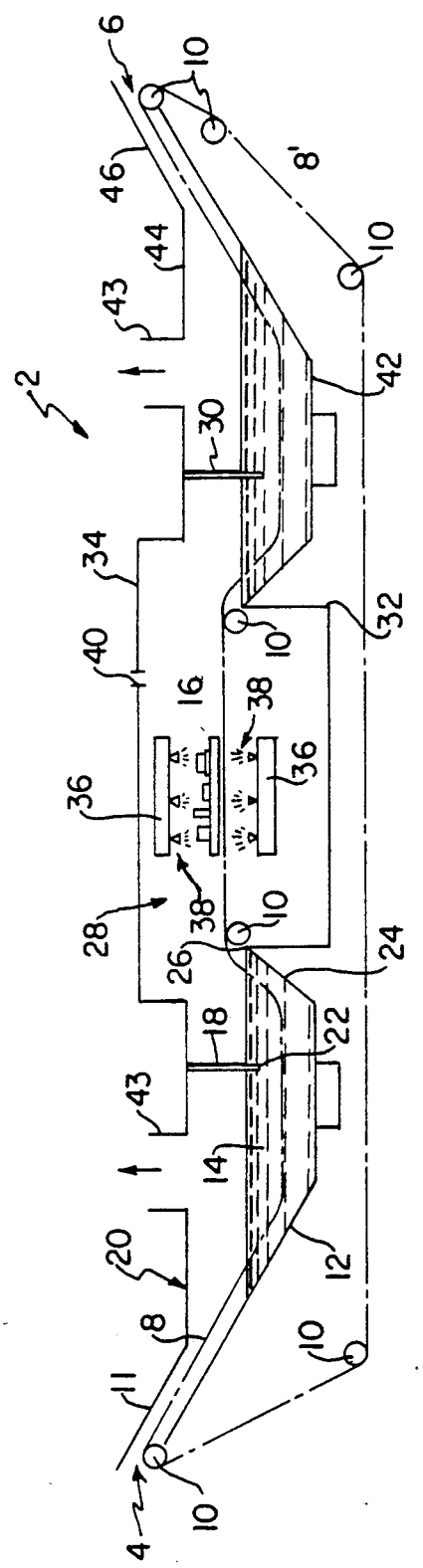
FIG. 1 is a schematic diagram illustrating a first embodiment of the invention.

Referring firstly to FIG. 1, it should be understood that the sides of the illustrated cleaning machine 2 lying in planes parallel to the plane of the drawing have been omitted to illustrate internal details. The cleaning machine 2 has an entrance 4 shown at the left-hand side of the figure and an exit 6 shown at the right-hand side. An endless mesh belt transport conveyor 8 passes through various treatment zones in the machine from the entrance to the exit with the return loop 8' of the conveyor being located outside the treatment zones. The conveyor 8 is carried on rollers, some of which are illustrated at 10, which constrain the conveyor to a predetermined path and also provide the driving force for the conveyor.

Starting from the entrance 4, the conveyor 8 passes along and down a sloping channel 11 which opens out into a tank 12 which contains a quantity of liquid cleaning solvent 14 through which the conveyor 8 passes. Tank 12 thus defines an immersion wash stage for the workpieces 16 carried on the conveyor 8. The liquid cleaning solvent in the tank is at room temperature or at some other temperature which is below the flash point of the solvent. This immersion wash stage can be described as a relatively quiet zone in the sense that there is little physical disturbance of the body of liquid solvent. This is enhanced by virtue of a vertical wall 18 extending down from the roof 20 of the tank into the liquid solvent 14, the lower end 22 of the wall being below the surface of the liquid solvent 14 and thereby serving as a liquid seal.

The left-hand side of tank 12 is sloped to conform to the slope of channel 11 and the right-hand side 24 of tank 12 is inclined in the opposite direction, terminating in a lip 26 at its upper end, this defining the uppermost level of the liquid solvent 14. The conveyor 8 follows the contours of tank 12 into a central zone 28 defined between liquid seal 18 and another liquid seal 30, described below, and comprising additionally a tray or tank 32 and a top 34 extending between liquid seals 18 and 30.

The central zone 28 should be understood to form a closed chamber formed by tank 32, top 34, liquid seals 18 and 30 and portions of the sides (omitted from the drawing) of the machine.

At least one set of spray nozzles 36 is located above and below the conveyor in zone 28, the nozzles being directed towards the conveyor for providing a spray 38 of low to ultra-high pressure of the solvent onto the workpiece to clean residue from the workpiece. The pump (or pumps) for providing the necessary pressure and the plumbing are omitted from the drawing as these features are not per se germane to the present invention. Reference may be made to U.S. Pat. No. 3,868,272, the disclosure of which is incorporated herein by reference, for further details of specific novel arrangements which may be utilized with the present invention.

The tank 32 in central zone 28 is shown dry but, in practice, there would be some liquid solvent in the tank which originated from the nozzles 36. A drain and or recirculating system could be provided for the liquid solvent which collects in tank 32.

A valved inlet 40 is provided in the top 34 of tank 32 for introducing an inert gas (or mixture of gases) such as $N_2$ into the central zone 28. This inert gas is retained in zone 28 by the liquid seals 18 and 30 and fills the entire spray zone including spaces between the droplets forming the spray. The exclusion of oxygen from this zone greatly reduces the risk of fire or explosion. Preferably, the pumps (and any other potentially fire producing components) for producing the spray are located under top 34 within the inert gas environment.

The right-hand side of the machine 2 is a mirror image of the left-hand side, comprising a tank 42 similar to tank 12 containing liquid cleaning solvent into which the liquid seal 30 extends from tank top 44 and an exit channel 46 sloping up to exit 6. Again the path of the conveyor 8 conforms to the slope of the sides and bottom of tank 42. Tank 42 is an immersion rinse stage which is functionally identical to the immersion wash stage provided by tank 12 except the solvent used in tank 42 is pure to ensure that any remaining contaminants are removed from the workpiece. As with tank 12, tank 42 defines a relatively quiet zone separated from the central zone 28 by a liquid seal.

Although the greatest potential fire hazard is believed to be in the central zone 28 and this has been neutralized by the inert gas, potentially flammable vapours above tanks 12 and 42 may be extracted through ports 43 in the tank tops 20 and 44. Alternatively, instead of withdrawing vapours in the quiet zones, the same or different inert gas as is pumped into the central zone could be pumped into the quiet zones through inlets located, for example, where the ports 43 are located. As another alternative a blanket of a compatible liquid could be floated on top of the liquid solvent in the tanks 12 and 42. Such a compatible liquid preferably would be a freon based solvent less powerful and less dense than the potentially flammable solvent and immiscible therewith. Of course, in tank 12 the liquid blanket would be confined to the left of liquid seal 18 and, in tank 42, the liquid blanket would be confined to the right of liquid seal 30. The need for such safety precautions in the quiet zones would depend on the vapour pressure and other characteristic properties of the solvent used.

As a further safety feature the entrance 4 to the quiet zone 12 and the exit 6 from the quiet zone 42 could be in the form of a fluid barrier curtain system as described in U.S. Pat. No. 4,696,226, the disclosure of which is incorporated herein by reference. Instead of the system described in that patent, the entrance 4 could consist of a double door arrangement to permit workpieces to enter via a first door which then closes before a second door opens to permit passage of the workpieces into the quiet zone 12. A similar double door arrangement would be provided at exit 6.

It is envisioned that each of the three zones could be monitored by detectors which detect and control the ratio of oxygen to other gases or liquids or at least set off an alarm indicating a hazardous mixture.

Other cleaning stages or components could be added to the machine of the instant invention without departing from the scope or spirit of the invention. For example, ultrasonic transducers 48 are shown in the bottom of each tank 12 and 42. Such ultrasonic components are commonly used in the art to provide improved cleaning in the two immersion stages.

Furthermore, although in the embodiment described above two immersion stages are used, it is envisaged that under some circumstances one immersion stage would suffice.

Figure 2:
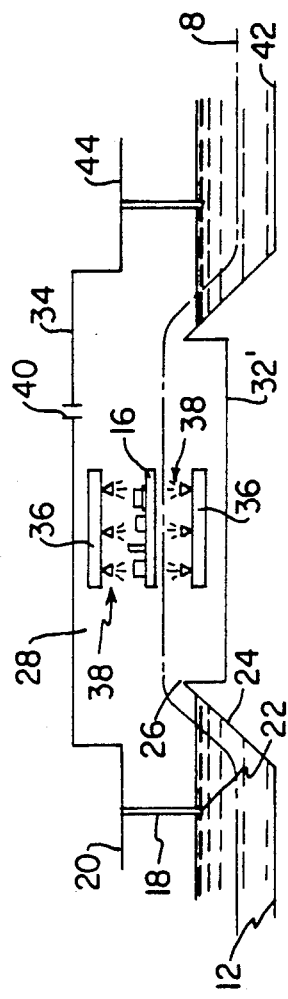
FIG. 2 is a schematic diagram illustrating a modified portion of a second embodiment of the invention.

Referring now to FIG. 2, this shows a modified central zone in which a shallow tray 32' replaces the relatively deep tank 32. By reducing in this way the volume of the central zone the fire or explosion hazard is greatly reduced. The rest of the machine can be as illustrated in FIG. 1. However, FIG. 2 shows the liquid solvent in tanks 12 and 42 not quite coming up to the lips 26.

Figure 3:
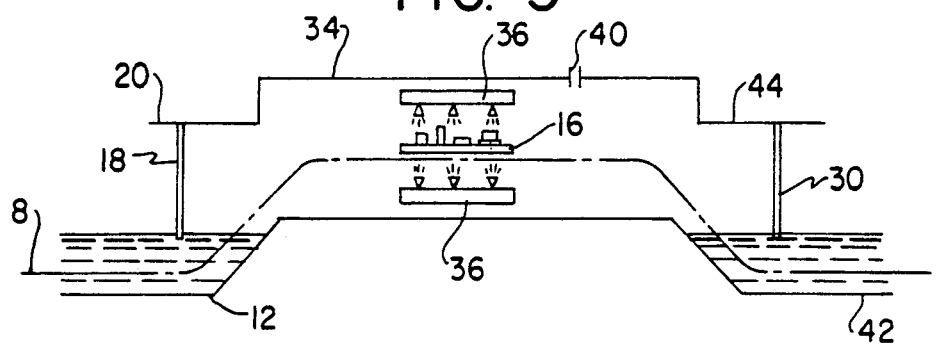
FIG. 3 is a schematic diagram illustrating an alternative modification of the invention.

In the further modification of FIG. 3 the central zone lacks entirely a tank or tray, the run off from the nozzles 36 going directly into the tanks 12 and 42. Thus, the volume of the central zone has been reduced further.

Figure 4:
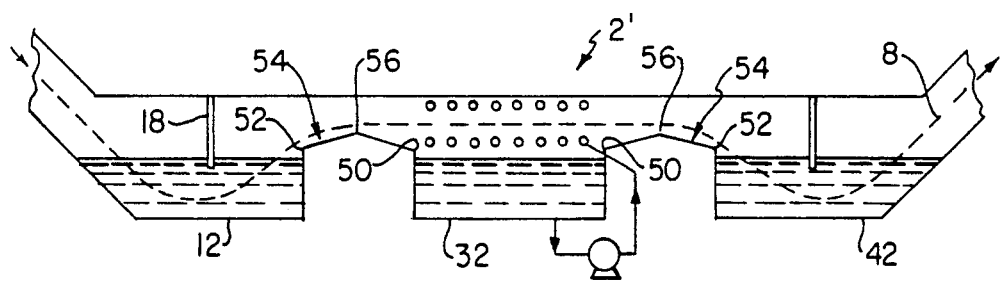
FIG. 4 is a schematic diagram of a further embodiment of the invention.

Referring now to FIG. 4, the cleaning machine 2' is virtually identical to the cleaning machine 2 of FIG. 1 except that the tank 32 of the central zone is not contiguous with the tanks 12 and 42 of the two immersion stages. In fact, two upper edges or lips 50 of tank 32 are connected to upper edges 52 of tanks 12 and 42, respectively, by means of two inverted V shaped surfaces 54 forming a ridge 56 intermediate tank 32 and tank 12 or 42.

In contrast to the first machine 2, cleaning machine 2' uses a conventional non-flammable (or low flammability) solvent in tank 12 of the first immersion stage and uses water in tank 42 of the second immersion stage. Only the spray stage uses the low flash point solvent. The V-shaped surfaces 54 allow run back of liquid to the proper tanks although there would be some carry-over of liquid from one tank to the next. This could be minimized by means of $N_2$ knives. It is noted that there would be no carry over of water to the tank 32 and so no foaming of the low flash point solvent would occur.

Make-up water for tank 42 could be provided by means of spray nozzles which would also operate as a final rinse.

Figure 5:
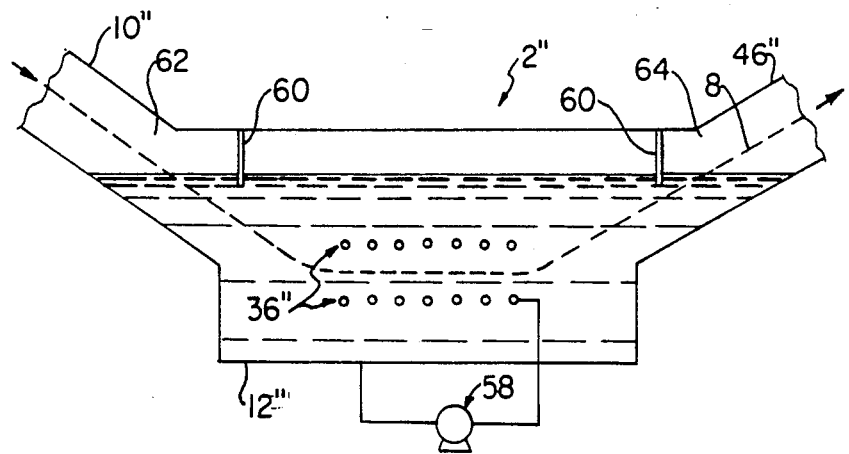
FIG. 5 is a schematic diagram of yet another embodiment of the invention.

FIG. 5 shows a further proposal for a machine designed to use low flash point solvent. In this case, the machine 2" consists of a single stage, which is an immersion stage comprising a tank 12" connected directly to an inlet channel " and an outlet channel 46". Spray nozzles 36" are located below the surface of the solvent in tank 12" on either side of conveyor 8. Pump 58 is shown connected to nozzles 36".

Two liquid seals 60 are located near opposite ends of the tank 12" to isolate the more turbulent portion of the liquid surface and an inert gas such as $N_2$ is introduced into the space between the two seals. $N_2$ could additionally be introduced into the entry and exit zones 62 and 64.

Because the spray jets are beneath the liquid surface atomization of the potentially flammable solvent is reduced.

We claim:

1. A method of cleaning workpieces using a potentially flammable or explosive liquid cleaning solvent, comprising passing the workpieces through an immersion wash stage comprising a tank of the solvent, then passing the workpieces through a spray wash stage in which inert gas is provided to reduce oxygen and reduce the danger of fire and explosion and in which the solvent is sprayed on the workpieces and then passing the workpieces through a further immersion wash stage comprising a tank of the solvent, in which the spray wash stage comprises a closed chamber sealed from both immersion wash stages.

2. A method according to claim 1, comprising constructing the spray wash stage in a manner such that its volume is reduced.

3. A method according to claim 2 comprising extracting vapours from the immersion stages.

4. A method according to claim 2 further providing the immersion stage with inert gas.

5. A method according to claim 2 providing the immersion stages with a compatible liquid which floats on the liquid solvent thereby to substantially fill the immersion stages.

6. A method according to claim 1, comprising extracting vapours from the immersion stages.

7. A method according to claim 1, further comprising also providing the immersion stages with inert gas.

8. A method according to claim 1, further providing the immersion stages with a compatible liquid which floats on the liquid solvent thereby to substantially fill the immersion stages.

9. A method of cleaning workpieces comprising passing the workpieces through an immersion wash stage comprising a tank of low-flammability liquid solvent, then passing the workpieces through a spray wash stage in which inert gas is provided to reduce oxygen and reduce the danger of fire and explosion and in which a different solvent, which is potentially flammable or explosive liquid, compatible with the solvent in the first immersion stage, is sprayed on the workpieces, and then passing the workpieces through a further immersion wash stage comprising a tank of water, in which the spray wash stage comprises a closed chamber sealed from both immersion wash stages.

10. A method of cleaning workpieces comprising passing the workpieces through a tank of potentially flammable or explosive liquid cleaning solvent while directing sprays of the solvent from nozzles immersed in the tank at the workpieces while they are immersed thereby reducing atomization of the solvent.

11. A method according to claim 10 comprising sealing at least a portion of the tank from entry and exit zones and introducing an inert gas into the sealed portion.

12. A method of cleaning workpieces using a potentially flammable or explosive liquid cleaning solvent, comprising passing the workpieces through an immersion wash stage comprising a tank of the solvent and through a spray wash stage in which inert gas is provided to reduce oxygen and reduce the danger of fire and explosion and in which the solvent is sprayed on the workpieces, the spray wash stage comprising a closed chamber sealed from the immersion wash stage.

* * * * *

UNITED STATES PATENT AND TRADEMARK OFFICE
CERTIFICATE OF CORRECTION

PATENT NO. : 5,045,120
DATED : September 3, 1991
INVENTOR(S) : MICHAEL T. MITTAG et al.

It is certified that error appears in the above—identified patent and that said Letters Patent is hereby corrected as shown below:

In the Drawings:

Sheet 1, Fig. 1, a reference numeral 48 should be applied to elements attached to bottoms of tanks 12 and 42;

a reference numeral 5 should be applied to solvent in the lower portion of the tank 42;

the arrow sign at the end of line 20 should be deleted;

a line should extend between numeral 16 and an element defining a workpiece located between nozzles 36.

Signed and Sealed this

Sixteenth Day of March, 1993

Attest:

STEPHEN G. KUNIN

Attesting Officer     Acting Commissioner of Patents and Trademarks